(12) United States Patent
Roberts

(10) Patent No.: US 6,517,997 B1
(45) Date of Patent: Feb. 11, 2003

(54) PRODUCTION OF AN INTEGRATED OPTICAL DEVICE

(75) Inventor: Stephen William Roberts, Botley (GB)

(73) Assignee: Bookham Technology plc, Oxon (GB)

( * ) Notice: Subject to any disclaimer, the term of this patent is extended or adjusted under 35 U.S.C. 154(b) by 0 days.

(21) Appl. No.: 09/578,513

(22) Filed: May 26, 2000

(30) Foreign Application Priority Data

May 29, 1999 (GB) ............................................. 9912505

(51) Int. Cl.$^7$ .............................. G03F 7/00; G03F 7/20
(52) U.S. Cl. ....................... 430/322; 430/311; 430/320; 430/321; 430/394
(58) Field of Search ................................ 430/311, 320, 430/321, 322, 394

(56) References Cited

U.S. PATENT DOCUMENTS

| | | | |
|---|---|---|---|
| 4,806,987 A | 2/1989 | Mori et al. | 355/53 |
| 4,963,177 A | 10/1990 | Najafi et al. | 65/30.13 |
| 5,705,299 A | 1/1998 | Tew et al. | 430/5 |
| 5,972,567 A | * 10/1999 | Hu | 430/312 |
| 6,030,752 A | * 2/2000 | Fulford, Jr. et al. | 430/312 |
| 6,285,488 B1 | * 9/2001 | Sandstrom | 359/290 |

FOREIGN PATENT DOCUMENTS

| | | |
|---|---|---|
| EP | 0 715 215 A1 | 6/1996 |
| GB | 2 300 932 A | 11/1996 |
| WO | WO 94/27187 | 11/1994 |
| WO | WO 97/36353 | 10/1997 |

OTHER PUBLICATIONS

UK Patent Office—Search Report Under Section 17 dated Aug. 2, 1999.

* cited by examiner

Primary Examiner—Janet Baxter
Assistant Examiner—Amanda C. Walke
(74) Attorney, Agent, or Firm—Fleshner & Kim, LLP

(57) ABSTRACT

A method of manufacturing an integrated optical device on a substrate is described wherein the device comprises first and second areas each containing at least one optical component. The first and second areas are separated by a third relatively featureless area, which provides optical communication between the first and second areas. The method uses a photolithographic stepper to define features of the optical components in the first area within a first exposure field and the features of the optical component(s) in the second area within a second exposure field, the stepper being moved between exposures so that first and second exposure fields are contiguous, and a line of contact or area of overlap between the first and second fields lies within the third, relatively featureless area of the substrate. The method may be used to form an arrayed waveguide grating with input waveguides within a first field, an array of curved waveguides in a second field and output waveguides in a third field, the fields overlapping in relatively featureless areas between the respective waveguide components.

39 Claims, 2 Drawing Sheets

PRODUCTION OF AN INTEGRATED OPTICAL DEVICE

BACKGROUND OF THE INVENTION

1. Field of the Invention

The present invention relates to the field of photonic circuitry, and more specifically to a method of manufacturing an integrated optical device.

2. Background of the Related Art

Integrated optical devices comprising optical components in discrete areas of a substrate are known. An example is an arrayed waveguide grating (hereafter referred to as an AWG) as commonly used for wavelength division multiplexing (WDM) in the field of optical telecommunications. A typical application of an AWG is to split light of multiple wavelengths from a single incoming optical fiber and send each wavelength to a different output fiber. In this way, signals may be transmitted on different optical wavelengths in the same fiber and then separated at the destination.

In practice, an AWG is usually integrated on a substrate by providing a series of input waveguides and a series of output waveguides, with an array of curved waveguides there between and separated from the input and output waveguides by a coupling (or "slab") region (see FIG. 1 described further below). Such an AWG is described further in U.S. Patent No. 5,002,350, the disclosure of which is incorporated by reference herein.

AWGs enable the spatial separation of optical wavelengths; this separation is a result of the optical path differences along each of the curved waveguides in the array. Typically, the lengths of the waveguides in the array are carefully designed so that each one is a constant distance longer than its shorter neighbor. Regardless of whether the increment is constant or varying, all AWGs require the lengths of the waveguides to be accurately calculated, defined and manufactured. If such devices are fabricated poorly, the errors in each of the waveguide path lengths causes a decrease in the isolation between neighboring wavelengths afforded by the device.

During the manufacture of AWGs it is necessary to transfer the design of the device onto a substrate (typically a silicon wafer) from which it is fabricated. Previously, this has been done using one of the following two methods:

a) using a 1:1 quartz/chromium optical mask and standard ultra-violet photoresist photolithography; or b) directly writing the pattern into a thin layer of resist on the material's surface by using a focused electron-beam.

Photolithographic stepper machines are known which contain imaging optics to reduce magnified design patterns, or masks, down to a required size on a material surface for example, in the fabrication of an integrated electronic circuit. Although such reduction provides a very accurate design image on the material surface, the finite size of the imaging optics imposes a restraint upon the maximum size of area (or "field") which the stepper machine can define in a single exposure. Thus, typically, such machines reduce a series of magnified masks to produce a larger design by way of "stepping" between different fields. The adjacent fields are joined or aligned, known as "stitching", to produce the overall, larger design and although stitching accuracy (often less than 100 nm in either direction) is sufficient, to maintain electrical contact between parts of an integrated electrical circuit, a potential misalignment of this magnitude may have substantial adverse effects in an integrated optical circuit as it may, for instance, impair or even destroy the optical communication between two sections of a waveguide or substantially affect the operation of a device by-changing the optical path lengths of the device. Thus, there is a need in the art for improved processing techniques to define optical features in integrated optical devices.

SUMMARY OF THE INVENTION

The present invention provides a method of manufacturing integrated optical devices such as AWGs which enable the devices to be made more accurately and with increased production yields.

Thus, according to a first aspect of the present invention there is a method of manufacturing an integrated optical device on a substrate, the device comprising first and second areas each containing at least one optical component to be defined with the first and second areas being separated by a third, relatively featureless area which provides optical communication between the first and second areas. The method comprises the use of a photolithographic stepper to define features of the optical components on the substrate, and being arranged to define the features of the optical component(s) in the first area within a first exposure field and the features of the optical component(s) in the second area within a second exposure field. The stepper is moved between exposures so that the first and second exposure fields are contiguous, the arrangement being such that a line of contact or area of overlap between the first and second fields lies within the said third, relatively featureless area of the substrate.

By arranging that the line of contact or area of overlap between the first and second fields lies within the third relatively featureless area of the substrate, it is possible to avoid offset or misalignment in the optical components that would occur if the line of contact or area of overlap lay across the optical component. Such offset, for example, between two parts of a waveguide, would interfere with the operation of the optical device and may, for instance, prevent the transmission of an optical signal through the device or disturb the lengths of optical paths within the device. However, any offset within the third, relatively featureless area is of much less consequence, since the third area contains no optical components the operation of which can be disrupted by a small misalignment between the fields.

In yet a further aspect, the present invention provides an integrated optical component obtainable by the method described above.

BRIEF DESCRIPTION OF THE DRAWINGS

The present invention will now be described in further detail with reference to the accompanying figures, in which.

DETAILED DESCRIPTION OF PREFERRED EMBODIMENTS

Figure 1:
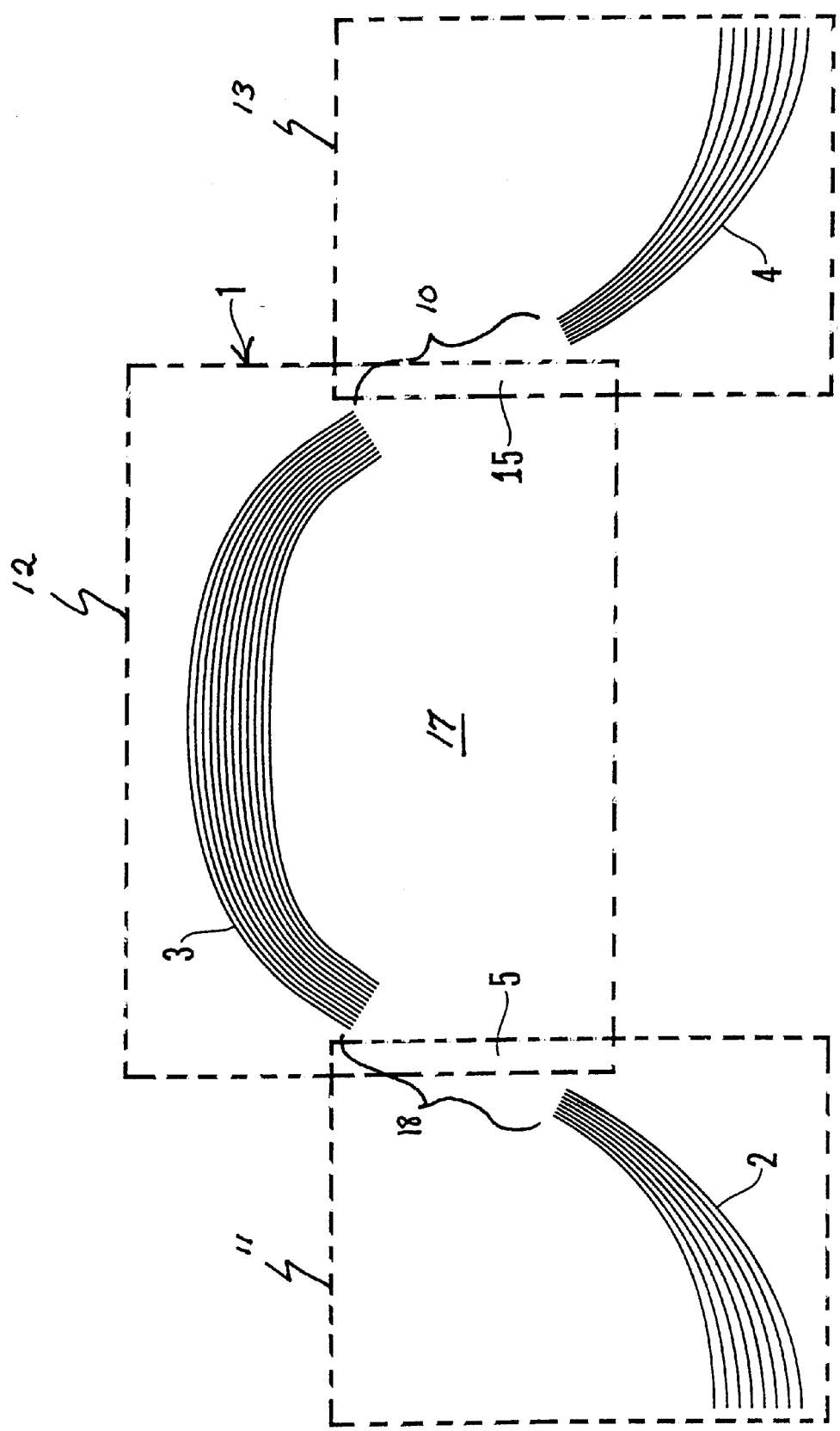
FIG. 1 illustrates the use of a stepper field arrangement for fabricating an optical device according to an embodiment of the invention.

FIG. 1 depicts an arrayed waveguide grating 1 including input waveguides 2, output waveguides 4, and curved waveguide array 3 defined in substrate 17. Substrate 17 is typically a silicon wafer or a silicon-on-insulator wafer. Waveguides 2 and 3 are separated by substrate coupler/

"slab" region 18 while waveguides 3 and 4 are separated by substrate coupler region 10. Wavelength-dependent phase delays induced by optical length differences in waveguide array 3 create interference in region 10 such that individual wavelengths are output onto different waveguides in output waveguides 4. It is noted that the configuration of the AWG in FIG. 1 is illustrative and that other configurations for AWGs (e.g., single input waveguide) or other phased-array gratings and/or waveguide routers as well as numerous other integrated optical devices may be manufactured using the present invention.

To fabricate AWG 1 according to one embodiment of the present invention, a first field 11 is defined containing input waveguides 2. Field 11, delineated by the dashed lines in FIG. 1, represents the area defined by the photolithographic stepper machine in a single exposure step. Thus, waveguides 2 may be completely formed in a single exposure of the photolithographic stepper.

A second field, 12, contains curved waveguide array 3; second field 12 overlaps first field 11 in overlapping region 5. Third field 13 includes output waveguides 4 and overlaps second field 12 in overlapping region 15.

Because the second field includes the entire curved array 3, the curved waveguide array 3 can be formed in a single exposure without the need to stitch two fields across the array. Potential errors due to stitching across the waveguides are thus avoided. Similarly, the input 2 and output 4 waveguides are each defined within single fields and are thus free from any possible stitching error. The regions 5, 15 where the fields overlap lie across the coupler (or "slab") regions between the waveguides. These coupler areas are relatively large and featureless so any slight misalignment of the fields where they are stitched together in these areas is of little or no consequence.

In the regions 5, 15 where the fields overlap, it may be desirable to incorporate alignment devices (such as Vernier scales) to assist in or verify the accurate alignment of adjacent fields.

The exposure fields are preferably aligned so that the line of contact, or the longitudinal axis of the area of overlap there between, is non-perpendicular to the direction of light transmitted from. the first field to the second field. Preferably, the line of contact, or the longitudinal axis of the area of overlap lies at an angle of at least 45° and more preferably at least 60° to the perpendicular to the direction of light transmitted from the first field to the second field. For example, in FIG. 1, the axis of such a boundary forms an angle of about 30° to the direction of light transmitted from the first field to the second field, i.e., at 60° to the perpendicular to the direction of light transmitted. Such orientation of the boundary helps reduce any effect misalignment of the first and second fields may have on operation of the device.

By reducing a series of magnified masks of predetermined pattern down to a predetermined size on the substrate with each exposure, the method of the present invention allows the photolithogaphical etching to be carried out to a much higher degree of accuracy than the prior art methods referred to above. Preferably the degree of reduction (i.e., demagnification) is by a factor of at least 3 and preferably by a factor of at least 5.

Typically, the exposure fields are rectangular, but any shape of field may be used as long as adjacent fields can be contiguous and as long as they overlap in regions of the device which are relatively featureless. Preferably, the fields have an area of at least 400 mm$^2$ and, more preferably, and area of at least 750 mm$^2$.

It should be noted that the above field sizes are relatively large for photolithographic stepping purposes and that photolithographic stepper machines required for such stepping, while available, are expensive; therefore they are generally only used for highly specialized applications, such as multi-gigabit DRAM electronic chips and ultra large scale integrated (ULSI) electronic microprocessors.

Figure 2:
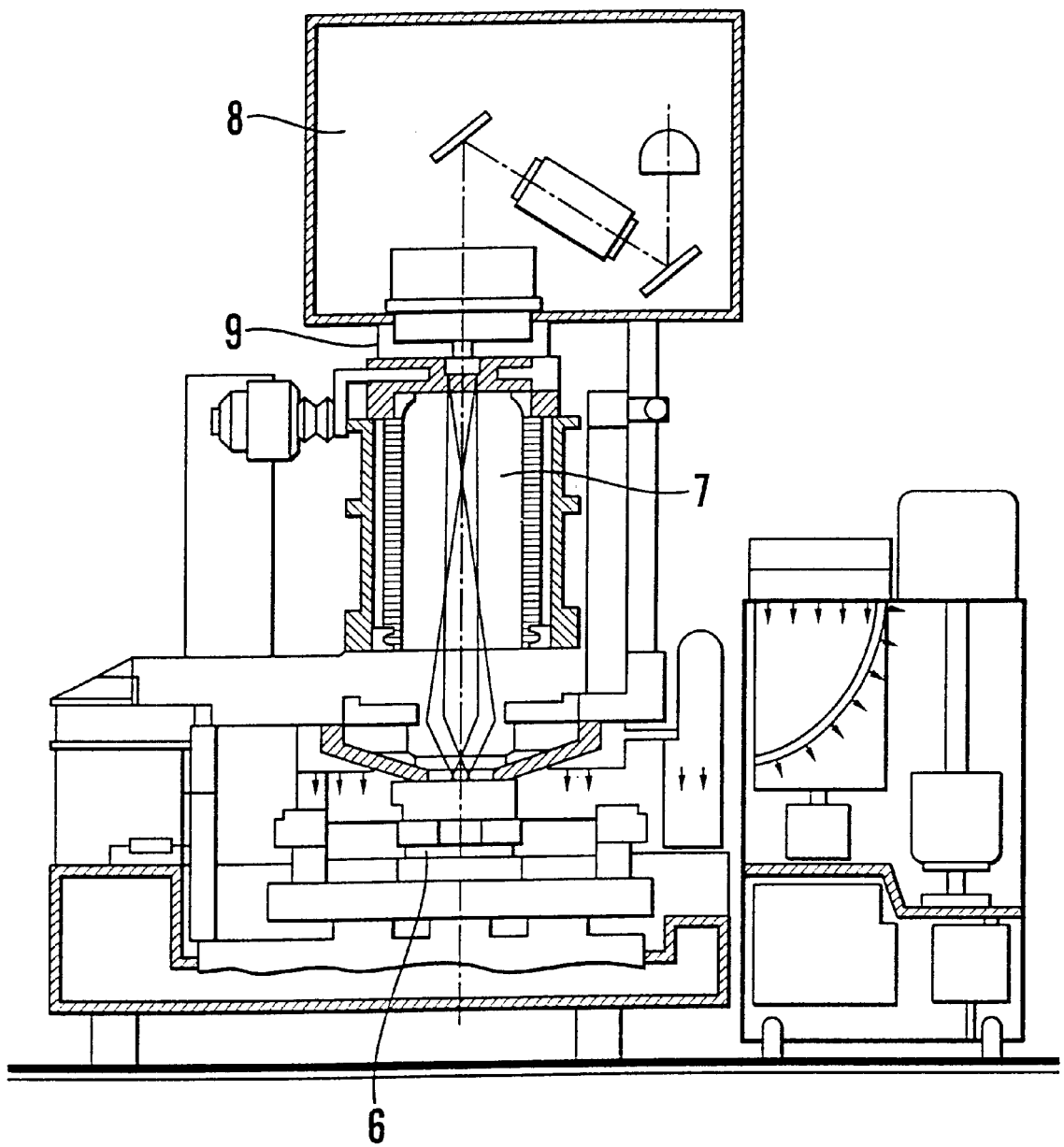
FIG. 2 illustrates a photolithographic stepper machine suitable for use in the invention.

The stepping procedure described above can be carried out using a photolithographic stepping machine. Typically, the selected stepper machine achieves a resolution of between 0.25 µm and 0.70 µm, for example 0.35 µm. An illustrative stepper machine is depicted in FIG. 2, for example the PAS 5500/100D produced by ASM Lithography. This is a high-throughput, ii-line stepper with a standard 5×lens which achieves 0.4 µm resolution with an alignment accuracy of ≦60 nm.

Such a stepper has a high speed stage 6 that steps the wafer precisely with respect to the imaging optics, moving the distances necessary to exactly repeat the image field in a Cartesian grid and thus fill the wafer surface. The stage 6 travels in the horizontal plane underneath a fixed, vertically mounted lens 7. The stage 6 can also be moved vertically by a small distance.

Once the wafer is placed on an exposure chuck and stepped under the lens 7, it is aligned by automatic systems that detect wafer targets optically and move the stage 6 in small increments to correct the wafer position with respect to the ideal image field.

De-magnified images of the mask pattern are projected onto the wafer surface by the microlithographic lens 7 mounted only a few millimeters above the wafer surface. An illumination system 8 exposes light through a chrome-on-glass reticle 9 that has the mask pattern etched in the chrome.

An integrated optical circuit such as the AWG described above comprising optical components separated by a relatively featureless area can be fabricated by stepping consecutively through the fields 11, 12, and 13 respectively containing the components, e.g., the input waveguides 2, then the array 3, and lastly the output waveguides 4, making sure that stitching only occurs in the relatively featureless areas between the respective components.

Thus, the present invention allows appropriate integrated optical devices, such as AWGs, to be manufactured with greater accuracy than conventional fabrication methods used in this field without errors in the device due to the lithographic process used.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of manufacturing an integrated optical device on a substrate, the device comprising first and second areas each containing at least one optical component with the first and second areas being separated by a third area which provides optical communication between the first and second areas, the method comprising the use of a photolithographic stepper to define features of the optical components on the substrate, the photolithographic stepper being arranged to define the features of the optical component(s) in the first area within a first exposure field and the features of the optical component(s) in the second area within a second exposure field, the stepper being moved between first and second exposure fields, the first and second exposure fields having a line of contact or area of overlap between the first and second fields that lie within the third area of the substrate wherein the optical component in at least one of the first and second areas is a waveguide.

2. A method as claimed in claim 1, wherein the first and second exposure fields are substantially rectangular.

3. A method as claimed in claim 2, wherein the rectangular fields are aligned so that the line of contact, or a longitudinal axis of the area of overlap there between, is non-perpendicular to the direction of light transmitted from the first field to the second field.

4. A method as claimed in claim 3, in which the line of contact, or longitudinal axis of the area of overlap is at an angle of at least 45° to the perpendicular to the direction of light transmitted from the first field to the second field.

5. A method as claimed in claim 1, wherein the first and second exposure fields have an area of at least 400 mm$^2$.

6. A method as claimed in claim 1, wherein the first and second exposure fields have an area of at least 750 mm$^2$.

7. A method as claimed in claim 1, wherein the stepper de-magnifies the features of the optical components during each exposure such that the degree of de-magnification is by a factor of at least 3.

8. A method as claimed in claim 7, wherein the stepper de-magnifies the features of the optical components during each exposure such that the degree of de-magnification is by a factor of at least 5.

9. A method as claimed in claim 1, wherein the substrate comprises a silicon wafer.

10. A method as claimed in claim 1, wherein the substrate comprises a silicon-on-insulator wafer.

11. A method as claimed in claim 1, wherein the stepper achieves a resolution of between 0.25 $\mu$m, and 0.70 $\mu$m.

12. A method as claimed in claim 1, wherein the waveguide is a waveguide array.

13. A method as claimed in claim 12, wherein the waveguide array is an arrayed waveguide grating.

14. A method as claimed in claim 1, wherein the third area includes a slab region between optical components defined by the photolithographic stepper in the first and second areas.

15. A method of manufacturing an integrated optical device on a substrate, the device comprising first and second areas each containing at least one optical component with the first and second areas being separated by a third area which provides optical communication between the first and second areas, the method comprising the use of a photolithographic stepper to define features of the optical components on the substrate, the photolithographic stepper being arranged to define the features of the optical component(s) in the first area and a first part of the third area within a first exposure field and the features of the optical component(s) in the second area and a second part of the third area within a second exposure field, the stepper being moved between first and second exposure fields, the first and second exposure fields having a line of contact or area of overlap between the first and second fields that lie within the third area of the substrate wherein the optical component in at least one of the first and second areas is a wave guide array.

16. A method as claimed in claim 15, wherein the first and second exposure fields are substantially rectangular.

17. A method as claimed in claim 16, wherein the rectangular fields are aligned so that the line of contact, or a longitudinal axis of the area of overlap there between, is non-perpendicular to the direction of light transmitted from the first field to the second field.

18. A method as claimed in claim 17, in which the line of contact, or longitudinal axis of the area of overlap is at an angle of at least 45° to the perpendicular to the direction of light transmitted from the first field to the second field.

19. A method as claimed in claim 15, wherein the first and second exposure fields have an area of at least 400 mm$^2$.

20. A method as claimed in claim 15, wherein the first and second exposure fields have an area of at least 750 mm$^2$.

21. A method as claimed in claim 15, the waveguide array is an arrayed waveguide grating.

22. A method as claimed in claim 15, wherein the third area includes a slab region between optical components defined by the photolithographic stepper in the first and second area.

23. A method of manufacturing an integrated optical device on a substrate, the device comprising first and second areas each containing at least one optical component with the first and second areas being separated by a third area which provides optical communication between the first and second areas, the method comprising the use of a photolithographic stepper to define features of the optical components on the substrate, the photolithographic stepper being arranged to define the features of the optical component(s) in the first area within a first exposure field and the features of the optical component(s) in the second area within a second exposure field, the stepper being moved between first and second exposure fields, the first and second exposure fields having a line of contact or area of overlap between the first and second fields that lie within the third area of the substrate wherein the first and second exposure fields are substantially rectangular and the rectangular fields are aligned so that the line of contact, or a longitudinal axis of the area of overlap there between, is non-perpendicular to the direction of light transmitted from the first field to the second field.

24. A method as claimed in claim 23, wherein the first and second exposure fields have an area of at least 400 mm$^2$.

25. A method as claimed in claim 23, wherein the first and second exposure fields have an area of at least 750 mm$^2$.

26. A method as claimed in claim 23, in which the line of contact, or longitudinal axis of the area of overlap is at an angle of at least 45° to the perpendicular to the direction of light transmitted from the first field to the second field.

27. A method as claimed in claim 23, wherein at least one optical component is a waveguide array.

28. A method as claimed in claim 27, wherein the waveguide array is an arrayed waveguide grating.

29. A method as claimed in claim 1, wherein the third area includes a slab region between optical components defined by the photolithographic stepper in the first and second areas.

30. A method of manufacturing an integrated optical device on a substrate, the device comprising first and second areas each containing at least one optical component with the first and second areas being separated by a third area which provides optical communication between the first and second areas, the method comprising the use of a photolithographic stepper to define features of the optical components on the substrate, the photolithographic stepper being arranged to define the features of the optical component(s) in the first area and a first part of the third area within a first exposure field and the features of the optical component(s) in the second area and a second part of the third area within a second exposure field, the stepper being moved between first and second exposure fields, the first and second exposure fields having a line of contact or area of overlap between the first and second fields that lie within the third area of the substrate, wherein the third area includes a slab region between optical components defined by the photolithographic stepper in the first and second areas.

31. A method as claimed in claim 30, wherein the first and second exposure fields arc substantially rectangular.

32. A method as claimed in claim 31, wherein the rectangular fields are aligned so that the line of contact, or a longitudinal axis of the area of overlap there between, is non-perpendicular to the direction of light transmitted from the first field to the second field.

33. A method as claimed in claim 32, in which the line of contact, or longitudinal axis of the area of overlap is at an angle of at least 45° to the perpendicular to the direction of light transmitted from the first field to the second field.

34. A method as claimed in claim 30, wherein the first and second exposure fields have an area of at least 400 mm$^2$.

35. A method as claimed in claim 30, wherein the first and second exposure fields have an area of at least 750 mm$^2$.

36. A method as claimed in claim 30, wherein the optical component in at least one of the first and second areas is a waveguide.

37. A method as claimed in claim 36, wherein the waveguide is an arrayed waveguide grating.

38. A method of manufacturing an integrated optical device on a substrate, the device comprising first and second areas each containing at least one optical component with, the first and second areas being separated by a third area which provides optical communication between the first and second areas, the method comprising the use of a photolithographic stepper to define features of the optical components on the substrate, the photolithographic stepper being arranged to define the features of the optical component(s) in the first area within a first exposure field and the features of the optical component(s) in the second area within a second exposure field, the stepper being moved between first and second exposure fields, the first and second exposure fields having a line of contact or area of overlap between the first and second fields that lie within the third area of the substrate wherein the first and second exposure fields have an area of at least 400 mm$^2$.

39. A method of manufacturing an integrated optical device on a substrate, the device comprising first and second areas each containing at least one optical component with the first and second areas being separated by a third area which provides optical communication between the first and second areas, the method comprising the use of a photolithographic stepper to define features of the optical components on the substrate, the photolithographic stepper being arranged to define the features of the optical component(s) in the first area within a first exposure field and the features of the optical component(s) in the second area within a second exposure field, the stepper being moved between first and second exposure fields, the first and second exposure fields having a line of contact or area of overlap between the first and second fields that lie within the third area of the substrate wherein the first and second exposure fields have an area of at least 750 mm$^2$.

\* \* \* \* \*